United States Patent [19]
Yoon

[11] Patent Number: 5,894,233
[45] Date of Patent: Apr. 13, 1999

[54] SENSE AMPLIFIERS INCLUDING BIPOLAR TRANSISTOR INPUT BUFFERS AND FIELD EFFECT TRANSISTOR LATCH CIRCUITS

[75] Inventor: Yong-jin Yoon, Seoul, Rep. of Korea

[73] Assignee: Samsung Electronics Co., Ltd., Kyungki-do, Rep. of Korea

[21] Appl. No.: 08/965,562

[22] Filed: Nov. 6, 1997

[30] Foreign Application Priority Data

Nov. 13, 1996 [KR] Rep. of Korea ............ 96/53782

[51] Int. Cl.$^6$ .................................... G11C 7/06
[52] U.S. Cl. ........................ 327/55; 327/57; 327/432
[58] Field of Search ............... 327/50–57, 432, 327/433; 365/185.21

[56] References Cited

U.S. PATENT DOCUMENTS

| | | | |
|---|---|---|---|
| 4,604,533 | 8/1986 | Miyamoto et al. | 327/53 |
| 5,247,479 | 9/1993 | Young | 365/189.05 |
| 5,287,314 | 2/1994 | Flannagan et al. | 365/208 |
| 5,345,120 | 9/1994 | Taylor | 327/55 |

*Primary Examiner*—Toan Tran
*Attorney, Agent, or Firm*—Myers Bigel Sibley & Sajovec

[57] ABSTRACT

Sense amplifiers for integrated circuit memory devices including a bipolar transistor voltage gain input buffer and a first effect transistor latch circuit. The bipolar transistor voltage gain input buffer is responsive to a pair of complementary input signals from a memory cell, to amplify the voltage differential between the pair of complementary input signals. The field effect transistor latch circuit is responsive to the bipolar transistor voltage gain input buffer, to latch the voltage differential so amplified, and thereby produce a pair of complementary output signals.

20 Claims, 3 Drawing Sheets

SENSE AMPLIFIERS INCLUDING BIPOLAR TRANSISTOR INPUT BUFFERS AND FIELD EFFECT TRANSISTOR LATCH CIRCUITS

FIELD OF THE INVENTION

This invention relates to integrated circuit memory devices, and more particularly to sense amplifiers for integrated circuit memory devices.

BACKGROUND OF THE INVENTION

Sense amplifiers are widely used in integrated circuit memory devices to sense a small voltage difference from a memory cell that is being read and to amplify the small difference to one of two binary logic levels. In general, it is desirable for the sense amplifier to sense this voltage difference rapidly and accurately, so that high speed and reliable read operations may be provided in integrated circuit memory devices.

As integrated circuit memory devices become more highly integrated, and are capable of storing more information in a single integrated circuit, the output of the individual memory cells may be reduced. For example, outputs of 20–100 mV may be provided. It is desirable for the sense amplifier to sense these microvoltage differentials rapidly and reliably.

FIG. 1 illustrates a conventional CMOS differential sense amplifier. As shown in FIG. 1, the sense amplifier employs both n-type and p-type metal oxide semiconductor field effect transistors (MOSFETs), also referred to as complementary MOSFETs or CMOS.

Referring now to FIG. 1, input signals IN and INB which correspond to the small voltage differential that is obtained from a sensed memory cell, are respectively provided to first and second input paths. These signals are applied to respective gates of n-type MOSFETs (referred to as NMOS) transistors 6 and 8. A pair of cross-coupled p-type MOSFET transistors (referred to as PMOS) 2 and 4 provide a latch. In particular, the sources of PMOS transistors 2 and 4 are commonly connected to a power supply node and the drains of the respective cross-coupled PMOS transistors 2 and 4 are connected to the drains of NMOS FETs 6 and 8. The drains and gates of PMOS transistors 2 and 4 are cross-coupled to provide a latch. Complementary output signals OUT and OUTB are obtained from the common drain node of MOSFETs 2 and 6 and from the common drain node of MOSFETs 4 and 8.

In operation, a small difference of voltage between the two input nodes IN and INB are amplified and output to the first and second output terminals OUT and OUTB. In particular, in response to a pre-sense amp enable signal PSE, transistors 10 and 12 are activated. Upon sensing a minute differential between input signals IN and INB, the latch comprising cross-coupled transistors 2 and 4 latches to one of two binary values and thereby provides complementary output signals on output terminals OUT and OUTB.

CMOS differential sense amplifiers as shown in FIG. 1 are described in more detail in U.S. Pat. No. 5,155,397 to Fassino et al. entitled "CMOS Differential Sense Amplifier". CMOS differential sense amplifiers as described in FIG. 1 can rapidly perform a sensing operation and can dissipate little power in standby mode. Unfortunately, if a signal is erroneously sensed, the sense amplifier may continuously repeat the erroneous sensing even though proper input signals are provided to the sense amplifier. Moreover, the minimum voltage differential which can be sensed reliably may be a function of the threshold voltage variations between the latch PMOS transistors 2 and 4. In order to overcome threshold voltage mismatches that may occur, sensing of the inputs may be delayed by delaying application of the pre-sense amp enable signal PSE. Thus, it may take an undesirably long time to reliably sense the input signal differential.

SUMMARY OF THE INVENTION

It is therefore an object of the present invention to provide high speed sense amplifiers that can provide error-free operation.

It is another object of the present invention to provide latch-type CMOS sense amplifiers that can provide high speed, reliable operation.

These and other objects are provided, according to the present invention, by sense amplifiers for integrated circuit memory devices that include a bipolar transistor voltage gain input buffer and a field effect transistor latch circuit. The bipolar transistor voltage gain input buffer is responsive to a pair of complementary input signals from a memory cell, to amplify the voltage differential between the pair of complementary input signals. The field effect transistor latch circuit is responsive to the bipolar transistor voltage gain input buffer, to latch the voltage differential so amplified, and thereby produce a pair of complementary output signals.

The bipolar transistors generally have a smaller threshold variation than the field effect transistor latch circuit. The threshold variations in the field effect transistors of the latch can create a difference in the voltage of the output terminals, referred to as an offset voltage. The bipolar transistors can rapidly provide a differential voltage which is larger than this offset voltage, because the threshold variation between the bipolar transistors is generally smaller than the threshold voltage variation between the field effect transistors. Accordingly, high speed and accurate sensing may be provided.

The bipolar transistor voltage gain input buffer preferably comprises a differential pair of bipolar transistors, and the field effect transistor latch circuit preferably comprises a cross-coupled pair of field effect transistors. The bipolar transistor voltage gain input buffer can further include a field effect transistor constant current source that supplies constant current to the differential pair of bipolar transistors. The cross-coupled pair of field effect transistors preferably are of first conductivity type and the field effect transistor latch circuit may further comprise a second pair of field effect transistors of second conductivity type, a respective one of which is coupled between a respective one of the differential pair of bipolar transistors and a respective one of the cross-coupled pair of field effect transistors. A pair of field effect transistor load transistors may also be included, a respective one of which is coupled to a respective one of the differential pair of bipolar transistors.

Sense amplifier circuits according to the present invention may include first through fourth field effect transistors and first and second bipolar transistors. The first and second field effect transistors are serially connected to define a first output node therebetween. The third and fourth field effect transistors are serially connected to define a second output node therebetween. The first and second bipolar transistors each have a base, an emitter and a collector. The emitters of the first and second bipolar transistors are commonly connected. The respective bases of the first and second bipolar transistors are connected to respective first and second complementary input signals from a memory cell. Each of the first through fourth field effect transistors includes a gate. The collector of the first bipolar transistor is connected to the gate of the second field effect transistor and the collector of the second bipolar transistor is connected to the gate of the fourth field effect transistor. The gate of the first field effect transistor is connected to the second output node and the gate of the third field effect transistor is connected to the first output node. In a preferred embodiment, the first and third field effect transistors are of first conductivity type and the second and fourth field effect transistors are of second conductivity type.

Sense amplifier circuits according to the invention may also include fifth and sixth field effect transistors. The first, second and fifth field effect transistors are serially connected between first and second reference voltages, and the third, fourth and sixth field effect transistors are also serially connected between the first and second reference voltages. The fifth and sixth field effect transistors each include a gate that is connected to an enable signal. The first and third field effect transistors preferably are of first conductivity type and the second, fourth, fifth and sixth field effect transistors are preferably of second conductivity type.

Seventh and eighth field effect transistors may also be provided, a respective one of which is serially connected between the first reference voltage and the respective collector of the first and second bipolar transistors. A ninth field effect transistor may also be provided that is connected between the commonly connected emitters of the first and second bipolar transistors and the second reference voltage.

Accordingly, the present invention can provide a voltage that is higher than the offset voltage due to mismatch of the threshold voltages of the latch-type PMOS transistors more quickly than a conventional CMOS differential sense amplifier. High speed, accurate sensing may thereby be provided.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Moreover, each embodiment described and illustrated herein includes its complementary conductivity type embodiment as well.

In the description that follows, numerous details of the components and operation of circuits according to the present invention are provided. However, it will be apparent to one skilled in the art that the present invention may be practiced using other components and operational parameters. Moreover, detailed descriptions of known functions and circuits will not be described, so as to avoid obscuring the subject matter of the present invention.

Figure 2:
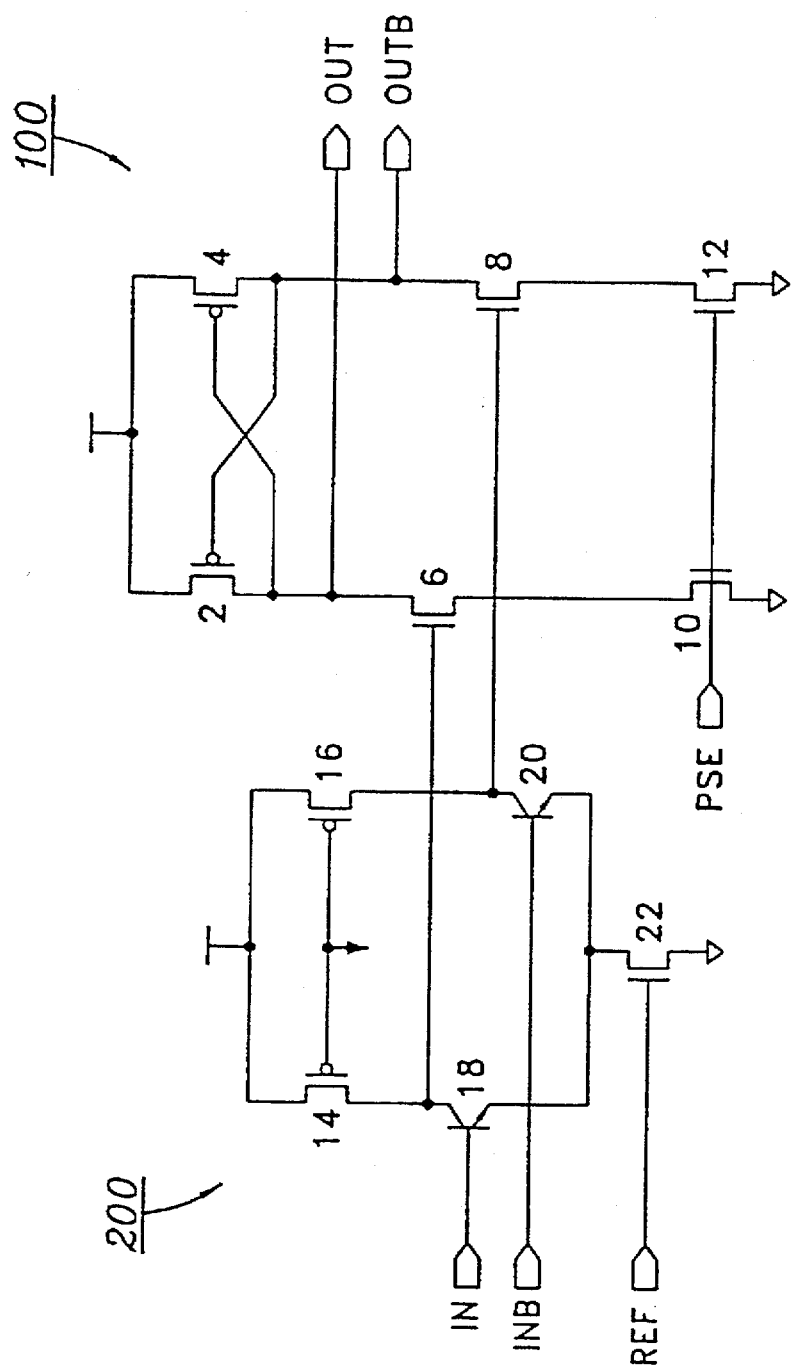
FIG. 2 is a circuit diagram of sense amplifiers according to the present invention.

Referring now to FIG. 2, sense amplifier circuits according to the present invention are illustrated. Reference number 100 generally designates a conventional field effect transistor latch circuit and reference number 200 generally designates a bipolar transistor voltage gate input buffer.

As shown in FIG. 2, the field effect transistor latch circuit 100 includes first and second field effect transistors 2 and 6 respectively, that are serially connected to define a first output node OUT therebetween. Third and fourth field effect transistors 4 and 8 respectively, are also serially connected to define a second output node OUTB therebetween. The first and third field effect transistors are cross-coupled by connecting the gate of the first field effect transistor 2 to the second output node OUTB and by connecting the gate of the third field effect transistor 4 to the first output node OUT.

The field effect transistor latch circuit 100 also includes fifth and sixth field effect transistors 10 and 12 respectively, such that the first, second and fifth field effect transistors 2, 6 and 10 respectively, are serially connected between first and second reference voltages such as power supply voltage and ground, and the third, fourth and sixth field effect transistors 4, 8 and 12 respectively, are also serially connected between the first and second reference voltages. The fifth and sixth field effect transistors 10 and 12 each include a gate that is connected to an enable signal PSE. As shown in FIG. 2, the first and third field effect transistors 2 and 4 respectively are preferably of first conductivity type and the second, fourth, fifth and sixth field effect transistors 6, 8, 10 and 12 respectively, are of second conductivity type.

Still referring to FIG. 2, input signals IN and INB are not directly connected to the gates of field effect transistors 6 and 8, as is conventionally the case. Rather, a bipolar transistor voltage gain input buffer 200 is provided. The voltage gain input buffer 200 is responsive to the pair of complementary input signals IN and INB from a memory cell to amplify the voltage differential between the pair of complementary input signals. In particular, as shown in FIG. 2, bipolar transistor voltage gain input buffer 200 includes first and second bipolar transistors 18 and 20 respectively, each having a base, an emitter and a collector. The emitters of the first and second bipolar transistors are commonly connected. The respective bases of the first and second bipolar transistors are connected to the respective first and second complementary input signals IN and INB from a memory cell. The collector of the first bipolar transistor 18 is connected to the gate of the second field effect transistor 6. The collector of the second bipolar transistor 20 is connected to the gate of the fourth field effect transistor 8.

Bipolar transistor voltage gain input buffer 200 also can include seventh and eighth field effect transistors 14 and 16, a respective one of which is serially connected between the first reference voltage such as power supply voltage and a respective collector of the first and second bipolar transistors 18 and 20. The seventh and eighth field effect transistors 14 and 16 can act as load transistors. Finally, a ninth field effect transistor 22 is connected between the commonly connected emitters of the first and second bipolar transistors 18 and 20 and the second reference voltage such as ground voltage. A reference voltage signal may be applied to field effect transistor 22 so that field effect transistor 22 acts as a constant current source.

Operation of sense amplifiers according to the present invention will now be described in connection with FIG. 2. When a pre-sense amp enable signal PSE at the gate of MOSFETs 10 and 12 becomes logic high, one of the output signals OUT and OUTB becomes logic low based on the voltage differentials at the gates of MOSFETs 6 and 8. For example, when the voltage applied to the gate of MOSFET 6 is relatively higher than the voltage applied to the gate of MOSFET 8, the level of the output signal OUT becomes lower than the output signal OUTB. Since the output signal OUT is fed back to the gate node of latch PMOS transistor 4, the PMOS transistor 4 is turned on and the voltage of the output signal OUTB rises to the power supply voltage. Moreover, since the voltage level of the output signal OUTB is also fed back to the gate node of PMOS transistor 2, the PMOS transistor 2 is turned off. Thus, although there only exists a small difference of the voltage between the input signals, the difference of the voltage between the output signals OUT and OUTB is amplified. When the pre-sense amp signal PSE becomes logic low, the operation of the CMOS latch-type sense amplifier circuit remains static. Thereafter, a next sensing operation is prepared by equalizing the output signals OUT and OUTB using a conventional equalizer circuit.

Unfortunately, if an erroneous input signal is applied to the CMOS latch-type sense amplifier circuit 100, it may be difficult for the circuit 100 to perform a normal operation even though a normal input signal is provided to the circuit, because the erroneous input signal has already changed the latch state. In other words, the changed voltage level of the output signals OUT and OUTB fixes the latch state, and may not be affected by the small input signals that are applied to each gate of the MOSFETs 6 and 8. Moreover, when there is a mismatch of the threshold voltage between adjacent transistors in the field effect transistor latch circuit, the latch circuit may not operate property until the voltage differential of the input signals is higher than this offset voltage level. Improper operation may be avoided conventionally by maintaining the pre-sense amp enable signal PSE at a logic high level for a long enough time so that the input signals become higher than the offset voltage levels. Unfortunately, this may slow down the entire operation of the integrated circuit memory device.

Sense amplifiers according to the present invention can reduce and preferably overcome these problems by rapidly providing input signals to the MOSFETs 6 and 8 that are at a higher level than the mismatched threshold voltage of the MOSFETs 6 and 8 or the offset voltage. In particular, by providing bipolar transistors in the input buffer circuit 200, the input signal differential can be provided to the sense amplifier circuit 100 more rapidly, because the threshold voltage variation in the bipolar transistors 18 and 20 is less than the threshold variation in field effect transistors. Stated differently, the threshold voltage variations in the field effect transistors of the latch create a difference in the voltage of the output terminals OUT and OUTB, which is referred to as an offset voltage. The bipolar transistors 18 and 20 can provide a differential voltage which is larger than this offset voltage more quickly, because the threshold variation between the bipolar transistors 18 and 20 is generally smaller than the threshold variation between the field effect transistors 2 and 4.

In particular, the voltage gain input buffer circuit 200 including bipolar transistors 18 and 20 can have offset levels that are one tenth that of the CMOS latch-type sense amplifier circuit 100. Thus, the initial voltage applied to each gate node of the MOSFETs 6 and 8 can be rapidly amplified. Accordingly, the voltage gain input buffer circuit 200 can prevent the CMOS latch-type sense amplifier circuit 100 from performing an erroneous operation and can also enhance the operational speed thereof by allowing reduced time to transition the pre-sense enable signal PSE to logic high level.

Figure 1:
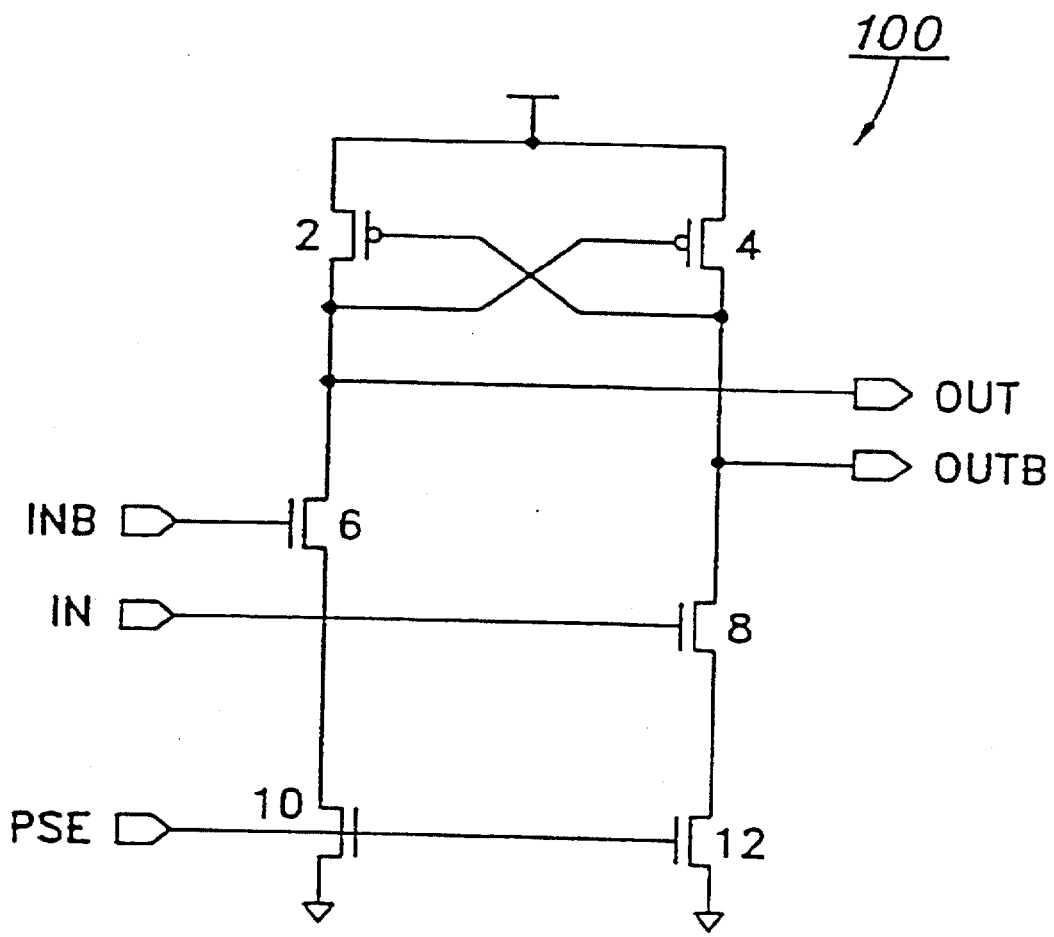
FIG. 1 is a circuit diagram of a conventional sense amplifier.
Figure 3:
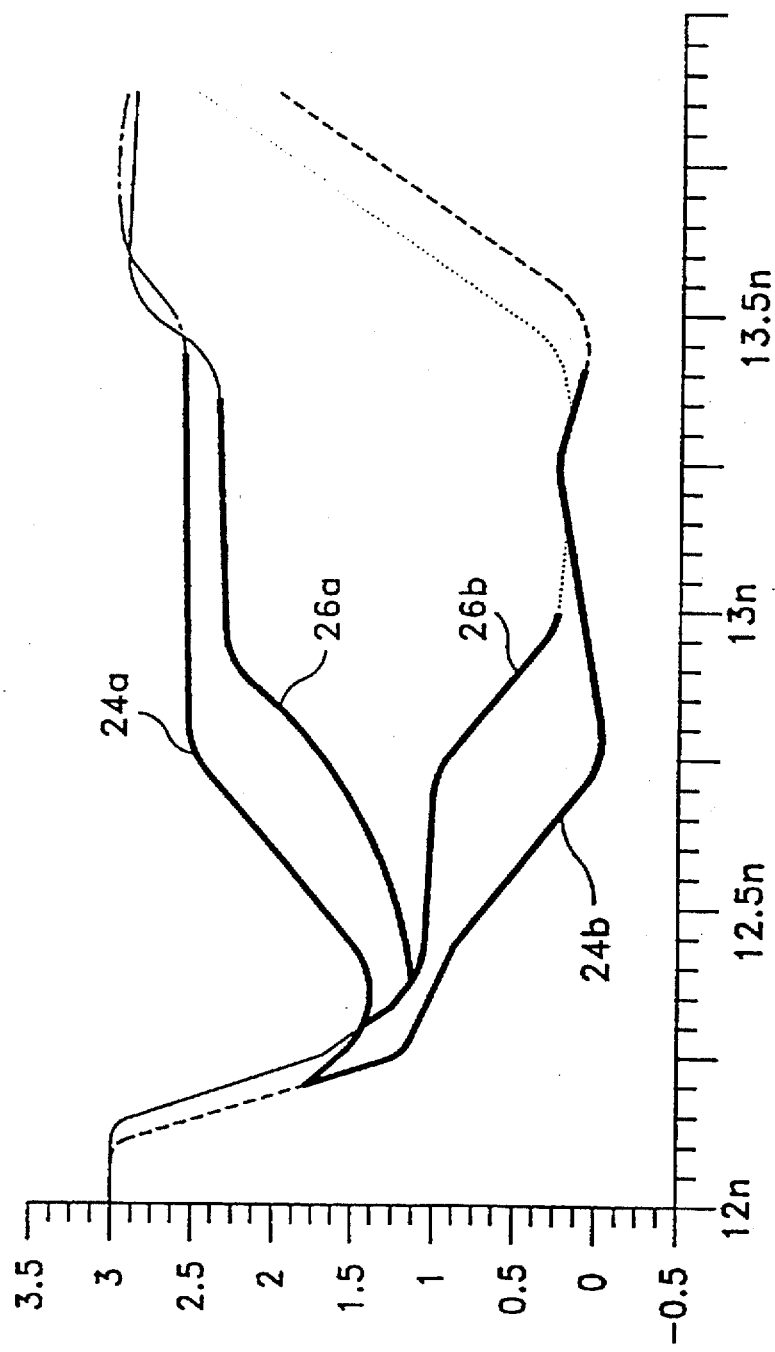
FIG. 3 graphically illustrates output signals of conventional sense amplifiers and sense amplifiers according to the present invention.

FIG. 3 graphically illustrates a comparison between conventional sense amplifiers of FIG. 1 and sense amplifiers according to the present invention of FIG. 2. As shown in FIG. 3, reference numerals 24a and 24b represent the output signals OUT and OUTB of FIG. 2 according to the present invention. Reference numerals 26a and 26b represent output signals OUT and OUTB of FIG. 1. As shown in FIG. 3, the amplification of the output signals OUT and OUTB begins more quickly than in a conventional CMOS sense amplifier. Accordingly, a voltage higher than the offset voltage may be provided more rapidly using the present invention compared to a conventional sense amplifier. Errors may be reduced, and the delay in transitioning a pre-sense amp enable signal PSE to logic high level may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A sense amplifier for an integrated circuit memory device comprising:
    a bipolar transistor voltage gain input buffer that is responsive to a pair of complementary input signals from a memory cell, to amplify the voltage differential between the pair of complementary input signals; and
    a field effect transistor latch circuit that is responsive to the bipolar transistor voltage gain input buffer, to latch the voltage differential so amplified and thereby produce a pair of complementary output signals.

2. A sense amplifier according to claim 1:
    wherein the bipolar transistor voltage gain input buffer comprises a differential pair of bipolar transistors; and
    wherein the field effect transistor latch circuit comprises a cross-coupled pair of field effect transistors.

3. A sense amplifier according to claim 2;
    wherein the bipolar transistor voltage gain input buffer further comprises a field effect transistor constant current source that supplies constant current to the differential pair of bipolar transistors;
    wherein the cross coupled pair of field effect transistors are of first conductivity type; and
    wherein the field effect transistor latch circuit further comprises a second pair of field effect transistors of second conductivity type, a respective one of which is coupled between a respective one of the differential pair of bipolar transistors and a respective one of the cross-coupled pair of field effect transistors.

4. A sense amplifier according to claim 3 wherein the bipolar transistor voltage gain input buffer further comprises a pair of field effect transistor load transistors, a respective one of which is coupled to a respective one of the differential pair of bipolar transistors.

5. A sense amplifier for an integrated circuit memory device, comprising:
    first and second field effect transistors that are serially connected to define a first output node therebetween;
    third and fourth field effect transistors that are serially connected to define a second output node therebetween;
    first and second bipolar transistors each having a base, an emitter and a collector, the emitters of the first and second bipolar transistors being commonly connected, the respective bases of the first and second bipolar transistors being connected to respective first and second complementary input signals from a memory cell;

each of the first through fourth field effect transistors including a gate, the collector of the first bipolar transistor being connected to the gate of the second field effect transistor, the collector of the second bipolar transistor being connected to the gate of the fourth field effect transistor, the gate of the first field effect transistor being connected to the second output node and the gate of the third field effect transistor being connected to the first output node.

6. A sense amplifier according to claim 5 wherein the first and third field effect transistors are of first conductivity type and wherein the second and fourth field effect transistors are of second conductivity type.

7. A sense amplifier according to claim 5 further comprising:

fifth and sixth field effect transistors, the first, second and fifth field effect transistors being serially connected between first and second reference voltages and the third, fourth and sixth field effect transistors being serially connected between the first and second reference voltages;

the fifth and sixth field effect transistors each including a gate that is connected to an enable signal.

8. A sense amplifier according to claim 7 wherein the first and third field effect transistors are of first conductivity type and wherein the second, fourth, fifth and sixth field effect transistors are of second conductivity type.

9. A sense amplifier according to claim 5 further comprising:

seventh and eighth field effect transistors, a respective one of which is serially connected between the first reference voltage and a respective collector of the first and second bipolar transistors.

10. A sense amplifier according to claim 5 further comprising a ninth field effect transistor connected between the commonly connected emitters of the first and second bipolar transistors and the second reference voltage.

11. A sense amplifier according to claim 9 further comprising a ninth field effect transistor connected between the commonly connected emitters of the first and second bipolar transistors and the second reference voltage.

12. A sense amplifier according to claim 9 wherein the first, third, seventh and eighth field effect transistors are of first conductivity type and wherein the second, fourth, fifth and sixth field effect transistors are of second conductivity type.

13. A sense amplifier according to claim 11 wherein the first, third, seventh and eighth field effect transistors are of first conductivity type and wherein the second, fourth, fifth, sixth and ninth field effect transistors are of second conductivity type.

14. A sense amplifier according to claim 7 further comprising:

seventh and eighth field effect transistors, a respective one of which is serially connected between the first reference voltage and a respective collector of the first and second bipolar transistors.

15. A sense amplifier according to claim 7 further comprising a ninth field effect transistor connected between the commonly connected emitters of the first and second bipolar transistors and the second reference voltage.

16. A sense amplifier according to claim 14 further comprising a ninth field effect transistor connected between the commonly connected emitters of the first and second bipolar transistors and the second reference voltage.

17. A sense amplifier according to claim 15 wherein the first, third, seventh and eighth field effect transistors are of first conductivity type and wherein the second, fourth, fifth and sixth field effect transistors are of second conductivity type.

18. A sense amplifier according to claim 16 wherein the first, third, seventh and eighth field effect transistors are of first conductivity type and wherein the second, fourth, fifth, sixth and ninth field effect transistors are of second conductivity type.

19. A sense amplifier for an integrated circuit memory device comprising:

a transistor input buffer that is responsive to a pair of complementary input signals from a memory cell, to amplify the voltage differential between the pair of complementary input signals; and a transistor latch circuit that is responsive to the transistor input buffer, to latch the voltage differential so amplified and thereby produce a pair of complementary output signals;

the transistor input buffer including transistors having smaller threshold variation than the transistor latch circuit.

20. A sense amplifier according to claim 19:

wherein the transistor input buffer comprises a differential pair of bipolar transistors; and wherein the transistor latch circuit comprises a cross-coupled pair of field effect transistors.

* * * * *